(12) United States Patent
Oh et al.

(10) Patent No.: US 7,245,526 B2
(45) Date of Patent: Jul. 17, 2007

(54) PHASE CHANGE MEMORY DEVICE PROVIDING COMPENSATION FOR LEAKAGE CURRENT

(75) Inventors: Hyung-Rok Oh, Seongnam-si (KR); Woo-Yeong Cho, Hwaseong-gun (KR); Hye-Jin Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/319,266

(22) Filed: Dec. 29, 2005

(65) Prior Publication Data
US 2006/0181915 A1 Aug. 17, 2006

(30) Foreign Application Priority Data
Feb. 16, 2005 (KR) .................. 10-2005-0012746

(51) Int. Cl.
*G11C 11/00* (2006.01)

(52) U.S. Cl. .................................. 365/163; 365/189.07
(58) Field of Classification Search ................. 365/163
See application file for complete search history.

(56) References Cited

U.S. PATENT DOCUMENTS 6,937,507 B2 * 8/2005 Chen .......................... 365/163
2004/0190351 A1 9/2004 Kaisha

* cited by examiner

*Primary Examiner*—Tan T. Nguyen
(74) *Attorney, Agent, or Firm*—Volentine & Whitt, PLLC (57) ABSTRACT

A semiconductor memory device includes a plurality of phase change memory cells connected to the same bitline and different respective word lines. A read operation is performed on one of the memory cells by selecting the bitline and a corresponding wordline. While the read operation is performed, leakage current produced by non-selected memory cells is detected by a leakage detecting circuit and compensated by a leakage current supply circuit.

20 Claims, 6 Drawing Sheets

PHASE CHANGE MEMORY DEVICE PROVIDING COMPENSATION FOR LEAKAGE CURRENT

BACKGROUND OF THE INVENTION

1. Field of the Invention

The present invention relates generally to a semiconductor memory device. More particularly, the invention relates to a phase change memory device adapted to compensate for leakage current in a read operation.

A claim of priority is made to Korean Patent Application No. 2005-0012746 filed on Feb. 16, 2005, the disclosure of which is hereby incorporated by reference in its entirety.

2. Description of Related Art

Phase change memory devices store data using phase change materials, such as chalcogenide, which are capable of stably transitioning between amorphous and crystalline phases. The amorphous and crystalline phases (or states) exhibit different resistance values, which are used to distinguish different logic states of memory cells in the memory devices. In particular, the amorphous phase exhibits a relatively high resistance, and the crystalline phase exhibits a relatively low resistance.

At least one type of phase change memory device—phase change random access memory (PRAM)—uses the amorphous state to represent a logical '1' and the crystalline state to represent a logical '0'. In a PRAM device, the crystalline state is referred to as a "set state", and the amorphous state is referred to as a "reset state". Accordingly, a memory cell in a PRAM stores a logical '0' by "setting" a phase change material in the memory cell to the crystalline state, and the memory cell stores a logical '1' by "resetting" the phase change material to the amorphous state. Various PRAM devices are disclosed, for example, U.S. Pat. Nos. 6,487,113 and 6,480,438.

The phase change material in a PRAM is converted to the amorphous state by heating the material to above a predetermined melting temperature and then quickly cooling the material. The phase change material is converted to the crystalline state by heating the material at another predetermined temperature below the melting temperature for a set period of time. Accordingly, data is written to memory cells in a PRAM by converting the phase change material in memory cells of the PRAM between the amorphous and crystalline states using heating and cooling as described.

The phase change material in a PRAM typically comprises a compound including germanium (Ge), antimony (Sb), and tellurium (Te), i.e., a "GST" compound. The GST compound is well suited for a PRAM because it can quickly transition between the amorphous and crystalline states by heating and cooling.

The memory cells in a PRAM are called "phase change memory cells". A phase change memory cell typically comprises a top electrode, a chalcogenide layer, a bottom electrode contact, a bottom electrode, and an access transistor. In the phase change memory cell, the chalcogenide layer is the phase change material. Accordingly, a read operation is performed on the phase change memory cell by measuring the resistance of the chalcogenide layer, and a write operation is performed on the phase change memory cell by heating and cooling the chalcogenide layer as described above.

Figure 1A:
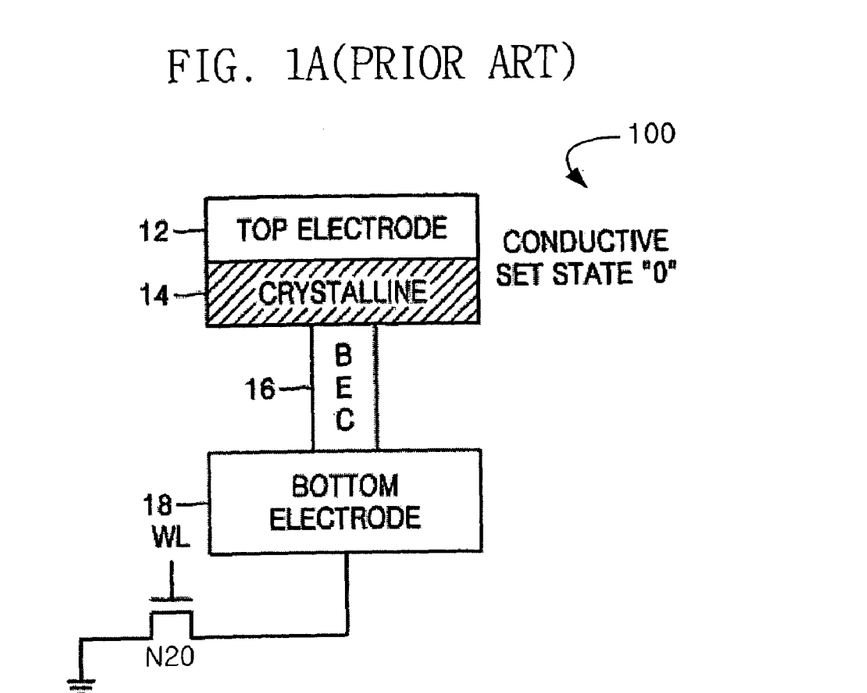
FIGS. 1A and 1B illustrate a conventional phase change memory cell 100 in two different states.
Figure 1B:
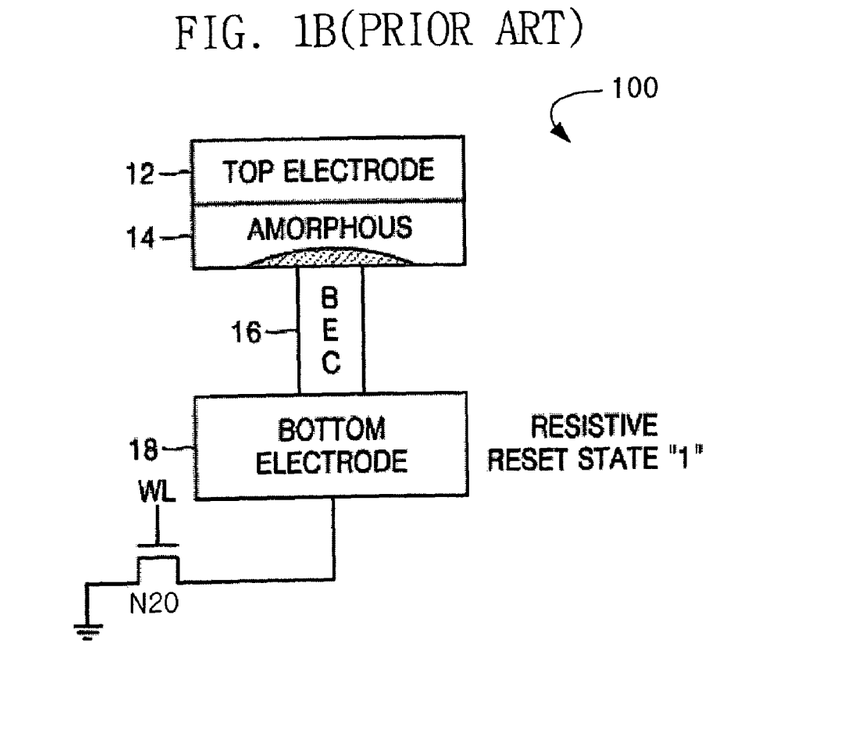

FIGS. 1A and 1B illustrate a conventional phase change memory cell 100 in two different states. In particular, FIG. 1A shows phase change memory cell 100 with a phase change layer (e.g., a chalcogenide layer) in the crystalline state, and FIG. 1B shows phase change memory cell 100 with the phase change layer is in the amorphous state.

Referring to FIGS. 1A and 1B, phase change memory cell 100 comprises a top electrode 12 formed on a phase change layer 14, and a bottom electrode contact (BEC) 16 connecting top electrode 12 to a bottom electrode 18 through phase change layer 14.

In FIG. 1A, memory cell 100 is in the "set state", and therefore stores a logical '0', and in FIG. 1B, memory cell 100 is in the "reset state", and therefore stores a logical '1'.

Memory cell 100 further comprises an access transistor N20 to control the flow of current through phase change layer 14. When current flows through phase change layer 14, bottom electrode contact 16 acts as a heater to heat phase change layer 14 and change its state. Access transistor N20 typically comprises a negative metal-oxide semiconductor (NMOS) transistor.

Figure 2:
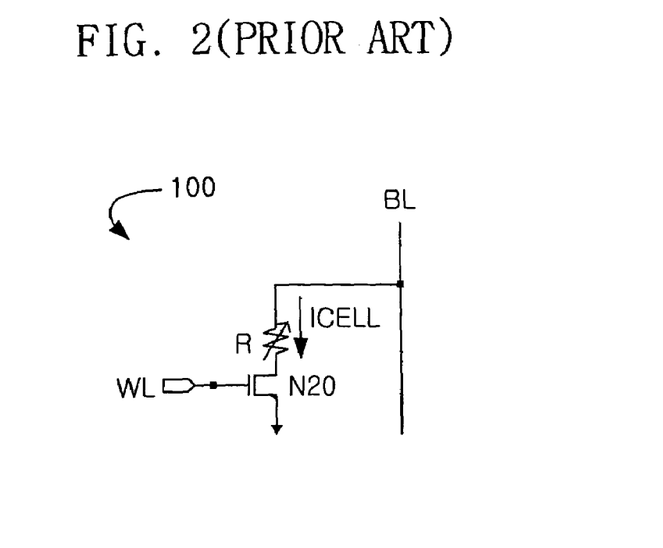
FIG. 2 is a circuit diagram of the memory cell shown in FIG. 1.

FIG. 2 is a circuit diagram of memory cell 100 shown in FIG. 1. In FIG. 2, top electrode 12, phase change layer 14, BEC 16, and bottom electrode 18 are represented as a phase change resistance element "R".

Referring to FIG. 2, memory cell 100 is controlled by a word line WL and a bit line BL. Wordline WL controls whether access transistor N20 is turned on and bitline BL provides a voltage for a current "ICELL" flowing through access transistor N20. Current "ICELL" flows through memory cell 100 when wordline WL and bitline BL are both activated. Wordline WL and bitline BL are used for both programming and reading memory cell 100.

Figure 3:
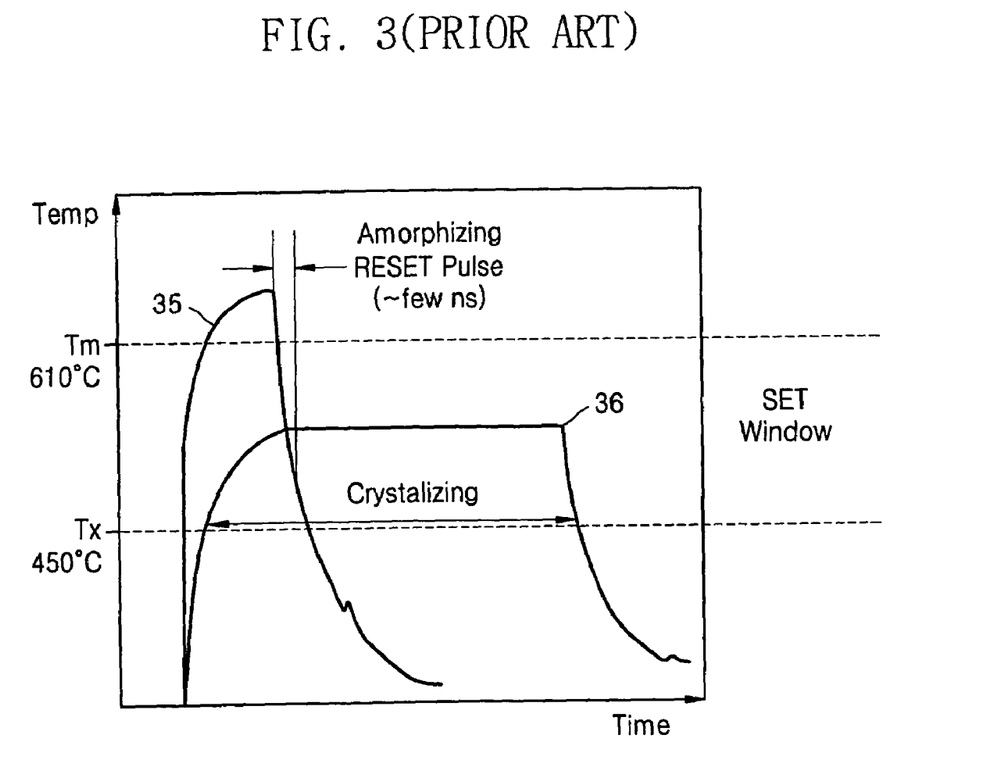
FIG. 3 is a timing diagram illustrating a programming operation of the memory cell shown in FIG. 1.

FIG. 3 is a timing diagram illustrating a programming operation of memory cell 100. In particular, FIG. 3 shows how time and a temperature applied to phase change layer 14 are used to program memory cell 100.

Referring to FIG. 3, a first curve 35 shows a time/temperature combination used to place memory cell 100 in the "reset state", and a second curve 36 shows a time/temperature combination used to place memory cell 100 in the "set state".

As shown in curve 35, phase change layer 14 is heated above a melting point "Tm" and then quickly cooled to change it to the amorphous state. As shown in curve 36, phase change layer 14 is heated to an intermediate temperature between melting point "Tm" and a crystalline temperature "Tx" for a predetermined amount of time, and then cooled to change it to the crystalline state. In FIG. 3, melting point "Tm" is set to 610° C. and crystalline temperature "Tx" is set to 450° C. However, these temperatures can be varied within reasonable ranges and still perform their desired function.

Figure 4:
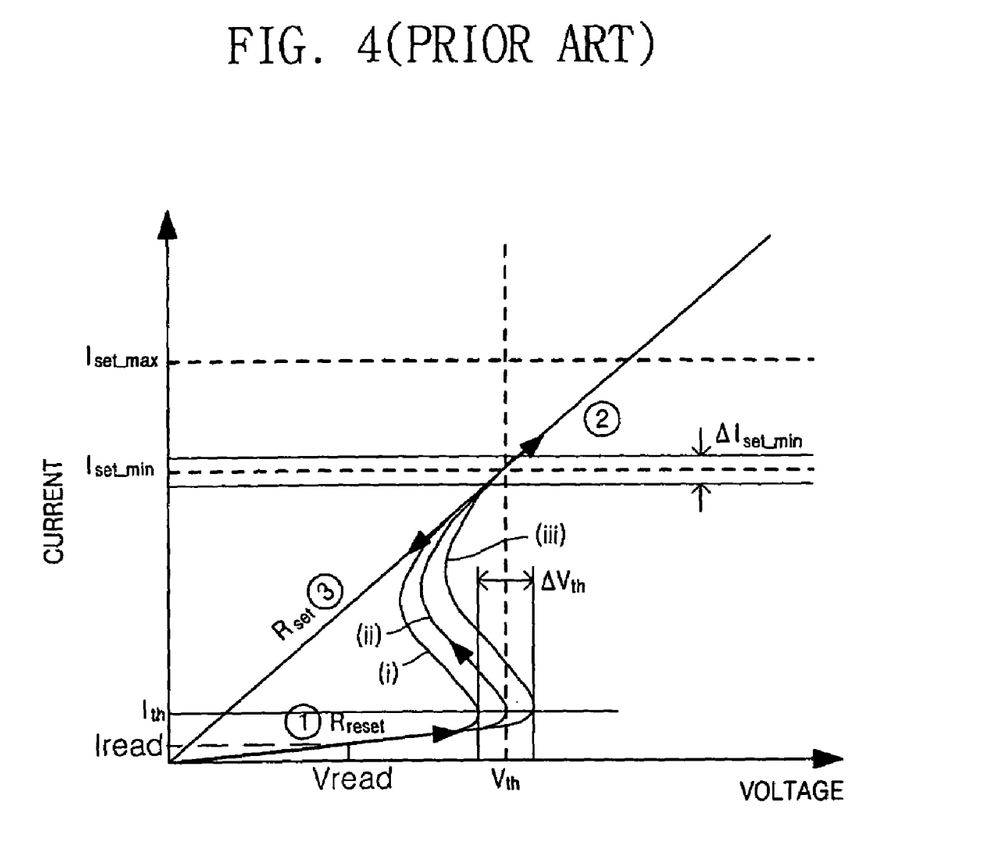
FIG. 4 illustrates a relationship between a voltage across phase change layer and the amount of current flowing through the phase change layer.

FIG. 4 illustrates a relationship between the voltage across phase change layer 14 and the amount of current flowing through phase change layer 14. Typically, the voltage across phase change layer 14 is varied by changing the voltage on bitline BL.

Referring to FIG. 4, phase change layer 14 performs very differently in the set state and the reset state. In FIG. 4, a symbol □ labels a curve showing the amount of current passing through phase change layer 14 in the reset state, and a symbol □ labels a curve showing the amount of current flowing through phase change layer 14 in the set state. A symbol □ labels a curve showing the amount of current flowing through phase change layer 14 when it is being programmed.

As seen in FIG. 4, a program voltage above a predetermined threshold voltage $V_{th}$ is applied to bitline BL to program memory cell 100, and a read voltage below threshold voltage $V_{th}$ is applied to bitline BL to read memory cell 100.

FIG. 4 shows an exemplary voltage level "Vread" used to read memory cell 100. When the voltage across phase change layer 14 has voltage level Vread, the current passing through phase change layer 14 has a level "Iread". A typical value for Vread is 0.4 to 0.6 times Vth.

Unfortunately, whenever a read voltage is applied to memory cell 100, leakage current escapes through non-selected memory cells that share bitline BL. As a result, the resistance of phase change layer 14 may be incorrectly read. Leakage currents become increasingly problematic as the size and power consumption of phase change memory devices becomes smaller, because as they do, their margin of error also decreases.

SUMMARY OF THE INVENTION

According to one embodiment of the invention, a semiconductor memory device comprises a plurality of phase change memory cells, each connected to a corresponding bitline and wordline, a read current supply circuit adapted to supply a read current to a sensing node connected to the bitline during a read operation of the semiconductor memory device, and a leakage compensating circuit comprising a capacitor adapted to store a leakage current volume and generate a leakage compensating current based on the stored leakage current volume, and apply the leakage compensating current to the sensing node during the read operation. The semiconductor memory device further comprises a sense amplifier circuit adapted to compare a voltage level of the sensing node with a sensing reference voltage.

According to another embodiment of the present invention, a method of performing a read operation in a phase change memory device comprising a plurality of phase change memory cells including a selected phase change memory cell connected to a bitline and at least one non-selected phase change memory cell also connected to the bitline, wherein the selected and non-selected phase change memory cells are connected to different respective word lines is provided. The method comprises applying a read current to the bit line of the selected phase change memory cell, sensing a leakage current generated by the at least one non-selected phase change memory cell, and storing a leakage current volume corresponding to the leakage current in a capacitor, generating a leakage compensating current corresponding to the leakage current volume, and applying the leakage compensating current to a sensing node electrically connected to the bitline, and comparing a voltage apparent at the sensing node to a reference voltage.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DETAILED DESCRIPTION OF THE INVENTION

Exemplary embodiments of the invention are described below with reference to the corresponding drawings. These embodiments are presented as teaching examples. The actual scope of the invention is defined by the claims that follow.

Figure 5:
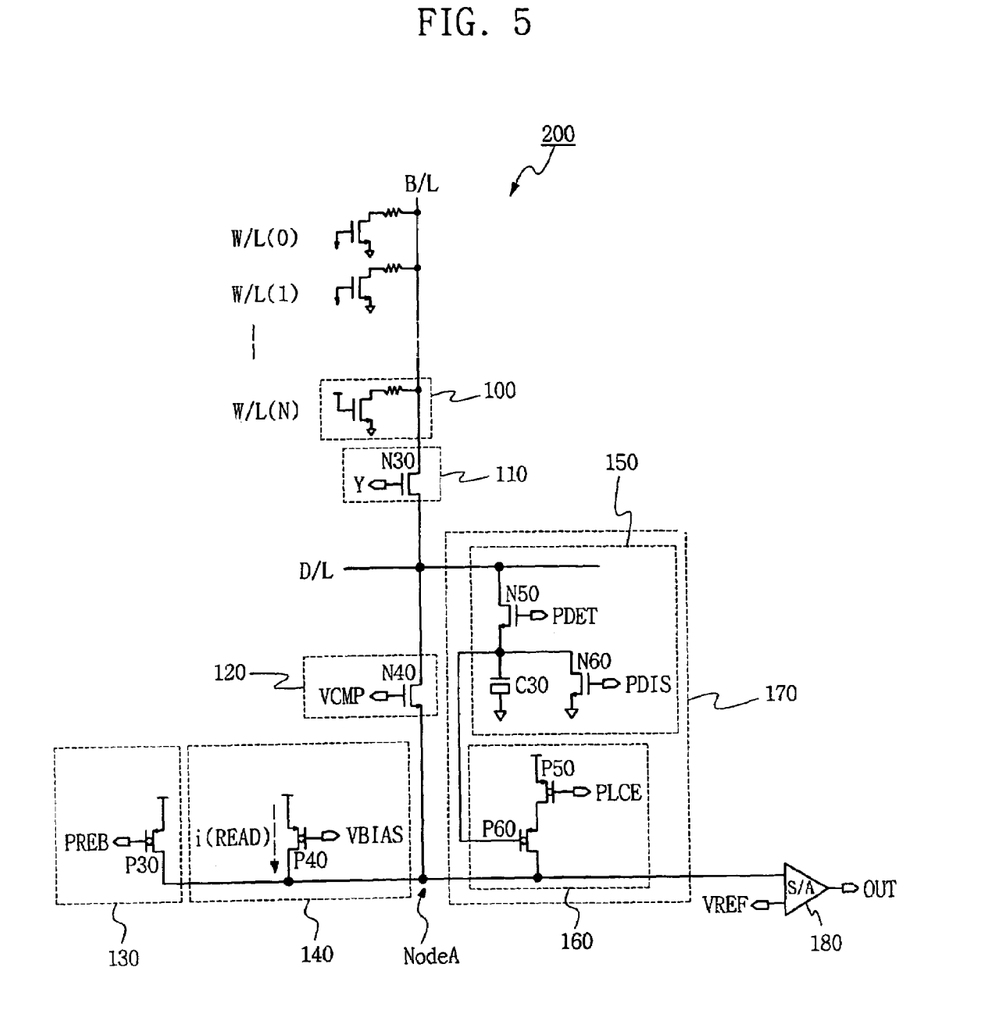
FIG. 5 illustrates a structure of a semiconductor memory device adapted to compensate for leakage current.
Figure 6:
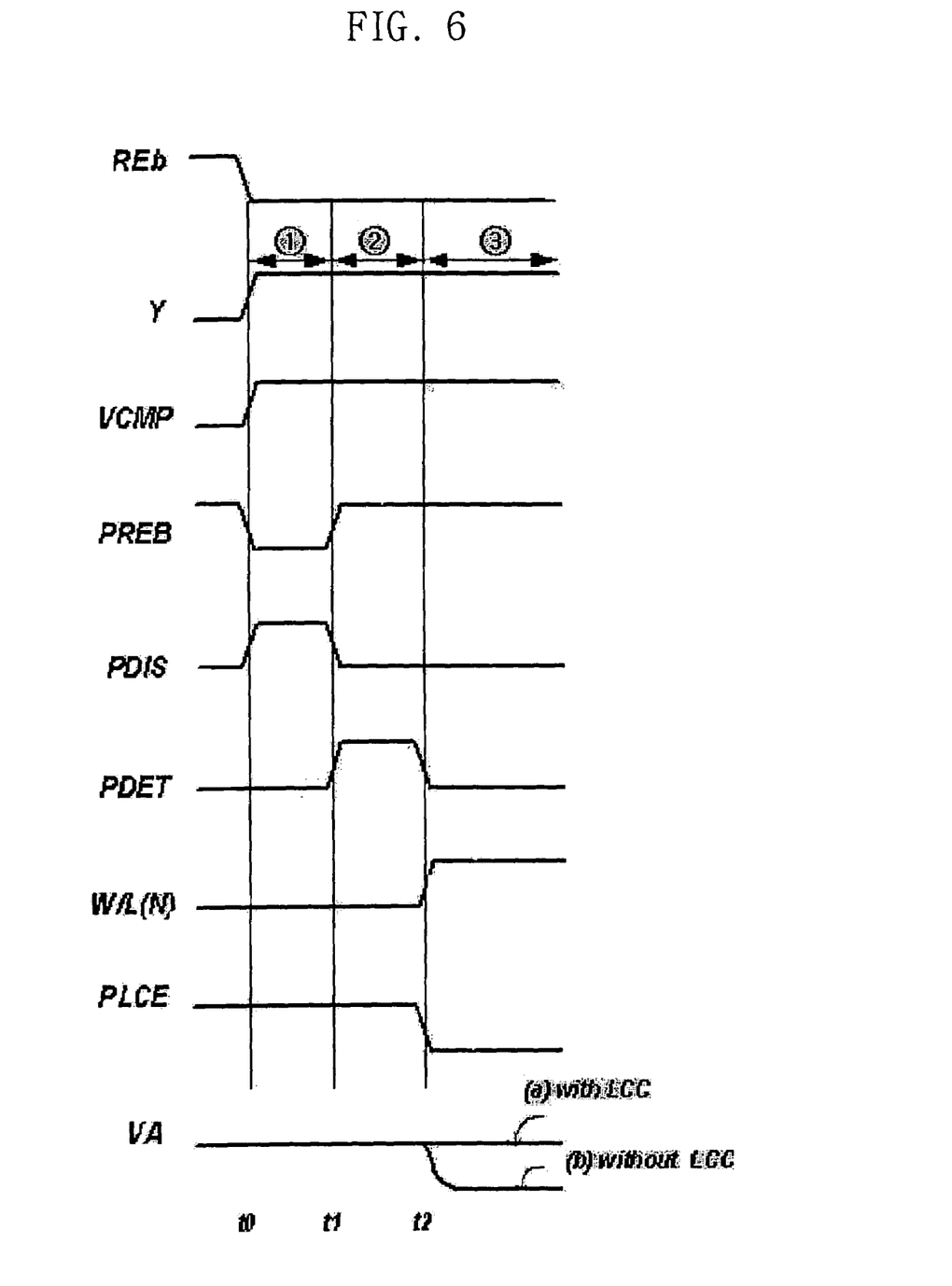
FIG. 6 illustrates the timing of a read operation performed on the semiconductor memory device shown in FIG. 5; and, FIG. 7 shows resistance distributions for phase change layers in phase change memory cells in respective set and reset states.

FIG. 5 illustrates a structure of a semiconductor memory device adapted to compensate for leakage current, and FIG. 6 illustrates the timing of a read operation performed in the semiconductor memory device shown in FIG. 5.

The semiconductor memory device described in relation to FIGS. 5 and 6 is a phase change memory device comprising a plurality of phase change memory cells formed with a phase change material, such as chalcogenide.

Referring to FIG. 5, a phase change memory device 200 comprises a memory array comprising a plurality of phase change memory cells 100, a column selection circuit 110, a clamping circuit 120, a precharge circuit 130, a read current supply circuit 140, a leakage compensating circuit 170 and a sense amplifier circuit 180. Leakage compensating circuit 170 comprises a leakage current detecting circuit 150 and a leakage current supply circuit 160.

Phase change memory cell 100 has the same structure in FIG. 5 that it does in FIG. 2. However, in various alternative embodiments, phase change resistance element "R" and access NMOS transistor N20 can be formed in different positions.

Column selection circuit 110 selects a bit line BL in response to a column selection signal "Y" input from a column decoder (not shown).

Clamping circuit 120 clamps the voltage level of bitline B/L at a level below threshold voltage $V_{th}$ of phase change layer 14 in response to a clamping signal VCMP.

Precharge circuit 130 precharges a sensing node (node A) through a positive metal-oxide semiconductor (PMOS) transistor P30 in response to a precharge signal PREB.

Read current supply circuit 140 supplies a read current "i(READ)" for a read operation to bit line BL and the sensing node through a PMOS transistor P40 in response to a read current supply signal VBIAS.

Leakage compensating circuit 170 stores a detected leakage current volume in a capacitor C30 through a NMOS transistor N50 controlled by a leakage detection signal PDET, and supplies a leakage current compensating current to the sensing node based on the stored leakage current volume. The term "leakage current volume" here denotes electrical charges accumulated in capacitor C30 due to leakage current flowing through non-selected phase change memory cells.

Once the leakage current compensating current is supplied to the sensing node, sense amplifier circuit 180 compares a voltage level of the sensing node with a sensing reference voltage VREF, and performs a read operation for a selected memory cell.

Referring to FIG. 6, leakage current in semiconductor memory device 200 is compensated in three steps: a precharge step ☐, a leakage detection step ☐, and a leakage compensating step ☐.

Precharge step ☐ is executed in response to a transition of a read signal REb. In precharge step ☐, column selection signal "Y" is activated to connect bit line B/L to a data line D/L. At the same time, clamping signal VCMP is activated to clamp the voltage levels of data line D/L and bitline B/L at a level below threshold voltage $V_{th}$.

Precharge signal PREB is deactivated to turn on PMOS transistor P30 so that a power supply voltage VDD is supplied to the sensing node through PMOS transistor P30. In addition, read current supply signal VBIAS is deactivated to turn on PMOS transistor P40 so that read current i(READ) is supplied to the sensing node through PMOS transistor P40. At the same time, a discharge signal PDIS is activated to turn on a NMOS transistor N40 N60 so that charges stored in capacitor C30 are discharged through NMOS transistor N40N60.

In leakage detection step ☐, precharge signal PREB is deactivated to turn off PMOS transistor P30. Discharge signal PDIS is also deactivated to turn off NMOS transistor N60. Leakage detection signal PDET is activated to turn on NMOS transistor N50, and a leakage current volume is stored at capacitor C30.

In leakage compensating step ☐, leakage detection signal PDET is deactivated to turn off NMOS transistor N50, thereby disabling leakage current detecting circuit 150. A word line selection signal W/L(N) is activated, and a leakage compensating enable signal PLCE controlling a PMOS transistor P50 is deactivated to turn on PMOS transistor P50. As a result, a leakage compensating current corresponding to the leakage current volume stored at capacitor C30 is supplied to the sensing node through PMOS transistor P50.

Figure 7:
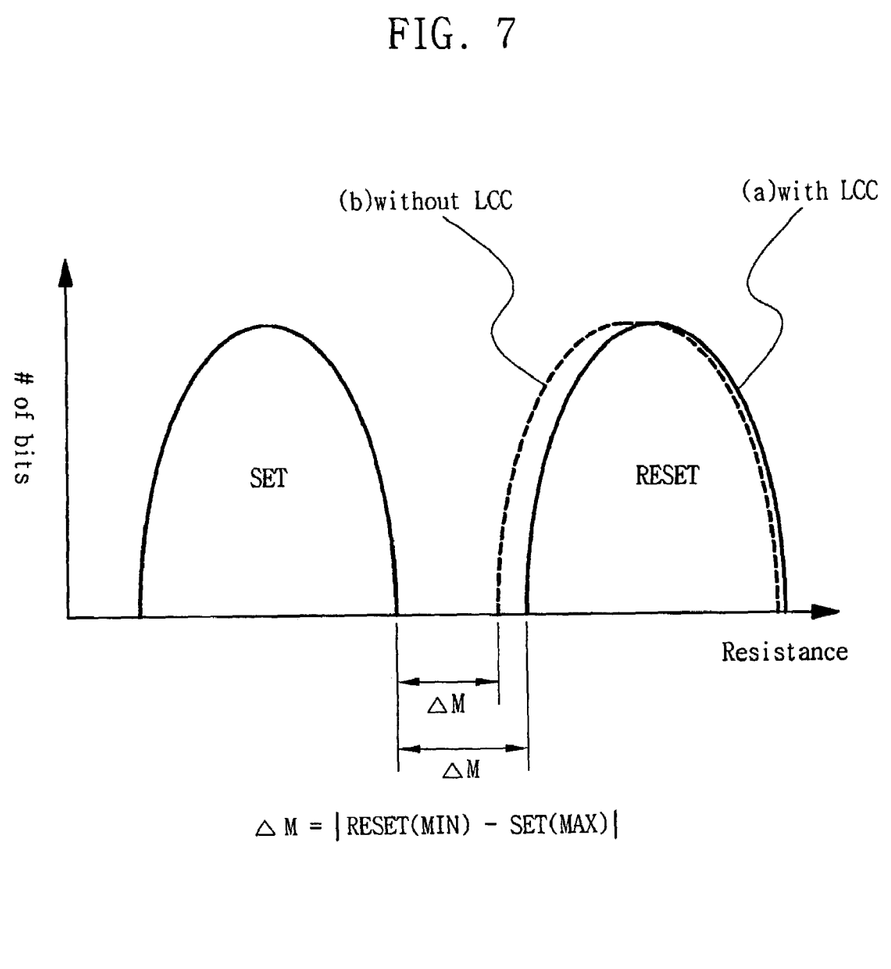

FIG. 7 illustrates how the leakage compensating current changes the resistance distribution of phase change layer 14 in phase change memory cell 100 in the set state and the reset state, respectively.

Referring to FIG. 7, the distribution of phase change layer 14 stays the same for the set state even when the leakage compensating current is applied to the sensing node. However, the distribution of phase change layer 14 changes from a distribution shown by a dotted line to a distribution shown by a solid line when the leakage compensating current is applied to the sensing node. Accordingly, a margin ΔM, defined as a difference between a minimum value of the resistance of phase change layer 14 in the reset state and a maximum value of the resistance of phase change layer 14 in the set state, decreases increases by applying the leakage compensating current to the sensing node.

Although the phase change memory cell described above comprises an access transistor coupled to a phase change resistance element, the invention could also be applied to phase change memory cells constructed of a diode and a resistor, or to a phase change memory cell comprising a phase change layer having a first side connected to ground and an access transistor having a gate connected to a word line, a first terminal connected to a second side of the phase change material, and a second terminal connected to a bitline.

As described above, a semiconductor memory device according to an exemplary embodiment of the invention compensates for a leakage current when necessary for a read operation by applying a leakage compensating current to a selected bit line.

The foregoing preferred embodiments are teaching examples. Those of ordinary skill in the art will understand that various changes in form and details may be made to the exemplary embodiments without departing from the scope of the present invention as defined by the following claims.

What is claimed:

1. A semiconductor memory device, comprising:
    a plurality of phase change memory cells, each connected to a corresponding bitline and wordline;
    a read current supply circuit adapted to supply a read current to a sensing node connected to the bitline during a read operation of the semiconductor memory device;
    a leakage compensating circuit comprising a capacitor adapted to store a leakage current volume and generate a leakage compensating current based on the stored leakage current volume, and apply the leakage compensating current to the sensing node during the read operation; and,
    a sense amplifier circuit adapted to compare a voltage level of the sensing node with a sensing reference voltage.

2. The device of claim 1, wherein the leakage compensating circuit comprises:
    a leakage current detecting circuit adapted to detect the leakage current volume; and,
    a leakage current supply circuit adapted to compensate for the leakage current volume.

3. The device of claim 2, wherein the leakage current detecting circuit comprises:
    a first transistor having a first terminal connected to the bitline, a second terminal connected to an upper electrode of the capacitor, and a gate adapted to receive a leakage detection signal; and,
    a second transistor having a first terminal connected to the second terminal of the first transistor, a second terminal connected to ground, and a gate receiving a discharge signal.

4. The device of claim 3, wherein the leakage current supply circuit comprises:
    a third transistor having a first terminal connected to a power supply, a second terminal, and a gate adapted to receive a leakage compensation enable signal; and,
    a fourth transistor having a first terminal connected to the second terminal of the third transistor, a second terminal connected to the sensing node, and a gate connected to the second terminal of the first transistor.

5. The device of claim 4, wherein the first and second transistors are negative metal-oxide semiconductor (NMOS) transistors and the third and fourth transistors are positive metal-oxide semiconductor (PMOS) transistors.

6. The device of claim 2, further comprising:
    a clamping circuit connected between the bitline and the sensing node and adapted to clamp a voltage level of the bit line.

7. The device of claim 6, wherein the clamping circuit clamps the voltage level of the bitline at a level below a threshold voltage of the phase change memory cell.

8. The device of claim 1, further comprising:
    a precharge circuit comprising a positive metal-oxide semiconductor (PMOS) transistor and adapted to precharge the sensing node in response to a precharge signal.

9. The device of claim 1, wherein each of the phase change memory cells comprises:
- a top electrode formed on a phase change layer;
- a bottom electrode contact connected between the phase change layer and a bottom electrode; and
- an access transistor connected between the bottom electrode and ground.

10. The device of claim 9, wherein the phase change layer comprises a chalcogenide layer.

11. The device of claim 1, wherein each of the phase change memory cells comprises:
- a top electrode formed on a phase change layer;
- a bottom electrode contact connected between the phase change layer and a bottom electrode; and
- a diode connected between the bottom electrode and ground.

12. The device of claim 11, wherein the phase change layer comprises a chalcogenide layer.

13. The device of claim 1, wherein each of the phase change memory cells comprises:
- a phase change layer having a first side connected to ground; and
- an access transistor having a gate connected to a word line, a first terminal connected to a second side of the phase change material, and a second terminal connected to a bitline.

14. The device of claim 13, wherein the phase change layer comprises a chalcogenide layer.

15. The device of claim 1, wherein each of the phase change memory cells comprises:
- a phase change layer having a first side connected to ground and a second side; and
- a diode having a first terminal connected to a bit line, a second terminal connected to a second side of the phase change material.

16. A method of performing a read operation in a phase change memory device comprising a plurality of phase change memory cells including a selected phase change memory cell connected to a bitline and at least one non-selected phase change memory cell also connected to the bitline, wherein the selected and non-selected phase change memory cells are connected to different respective word lines, the method comprising:
- applying a read current to the bit line of the selected connected to the phase change memory cells;
- sensing a leakage current generated by the at least one non-selected phase change memory cells, and storing a leakage current volume corresponding to the leakage current in a capacitor;
- activating a word line selection signal to select a phase change memory cell;
- generating a leakage compensating current corresponding to the leakage current volume, and applying the leakage compensating current to a sensing node electrically connected to the bitline; and,
- comparing a voltage apparent at the sensing node to a reference voltage.

17. The method of claim 16, wherein applying the read current to the bit line of the selected phase change memory cell comprises:
- applying a read current supply signal to a transistor in a read current supply circuit to connect a power supply to the sensing node.

18. The method of claim 17, wherein applying the read current to the bit line of the selected phase change memory cell further comprises:
- applying a clamping signal to a transistor in a clamping circuit to electrically connect the bitline to the sensing node.

19. The method of claim 16, wherein sensing the leakage current generated by the at least one non-selected phase change memory cells comprises:
- applying a detection signal to a transistor in a leakage current detecting circuit to electrically connect the capacitor to the bitline.

20. The method of claim 16, wherein generating the leakage compensating current corresponding to the leakage current volume comprises:
- applying a leakage compensating enable signal to a transistor in a leakage current supply circuit.

* * * * *